(12) United States Patent
Mehrad et al.

(10) Patent No.: US 7,910,422 B2
(45) Date of Patent: Mar. 22, 2011

(54) REDUCING GATE CD BIAS IN CMOS PROCESSING

(75) Inventors: Freidoon Mehrad, Plano, TX (US); Jinhan Choi, San Ramon, CA (US); Frank Scott Johnson, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 207 days.

(21) Appl. No.: 12/241,798

(22) Filed: Sep. 30, 2008

(65) Prior Publication Data

US 2009/0166629 A1 Jul. 2, 2009

Related U.S. Application Data

(60) Provisional application No. 61/017,859, filed on Dec. 31, 2007.

(51) Int. Cl.
*H01L 21/8238* (2006.01)

(52) U.S. Cl. .......... 438/199; 438/229; 438/587

(58) Field of Classification Search .......... 438/199, 438/229, 233, 585, 587; 257/338, 368, 369
See application file for complete search history.

(56) References Cited

U.S. PATENT DOCUMENTS

| | | | | |
|---|---|---|---|---|
| 5,882,962 A * | 3/1999 | Tseng et al. | .......... | 438/197 |
| 6,391,751 B1 * | 5/2002 | Wu et al. | .......... | 438/585 |
| 6,399,453 B2 * | 6/2002 | Nagai et al. | .......... | 438/305 |
| 6,503,788 B1 * | 1/2003 | Yamamoto | .......... | 438/231 |
| 6,524,902 B2 * | 2/2003 | Rhee et al. | .......... | 438/199 |
| 6,677,652 B2 * | 1/2004 | Lin et al. | .......... | 257/407 |
| 7,268,029 B2 * | 9/2007 | Chung et al. | .......... | 438/199 |
| 2002/0042173 A1 * | 4/2002 | Takamura | .......... | 438/199 |
| 2005/0189597 A1 * | 9/2005 | Masuoka et al. | .......... | 257/371 |
| 2006/0160290 A1 * | 7/2006 | Chong et al. | .......... | 438/199 |
| 2008/0113480 A1 * | 5/2008 | Nishida et al. | .......... | 438/278 |

* cited by examiner

*Primary Examiner* — Kevin M Picardat
(74) *Attorney, Agent, or Firm* — Warren L. Franz; Wade J. Brady, III; Frederick J. Telecky, Jr.

(57) ABSTRACT

A method of forming an integrated circuit having an NMOS transistor and a PMOS transistor is disclosed. The method includes performing pre-gate processing in a NMOS region and a PMOS region over and/or in a semiconductor body, and depositing a polysilicon layer over the semiconductor body in both the NMOS and PMOS regions. The method further includes performing a first type implant into the polysilicon layer in one of the NMOS region and PMOS region, and performing an amorphizing implant into the polysilicon layer in both the NMOS and PMOS regions, thereby converting the polysilicon layer into an amorphous silicon layer. The method further includes patterning the amorphous silicon layer to form gate electrodes, wherein a gate electrode resides in both the NMOS and PMOS regions.

26 Claims, 7 Drawing Sheets

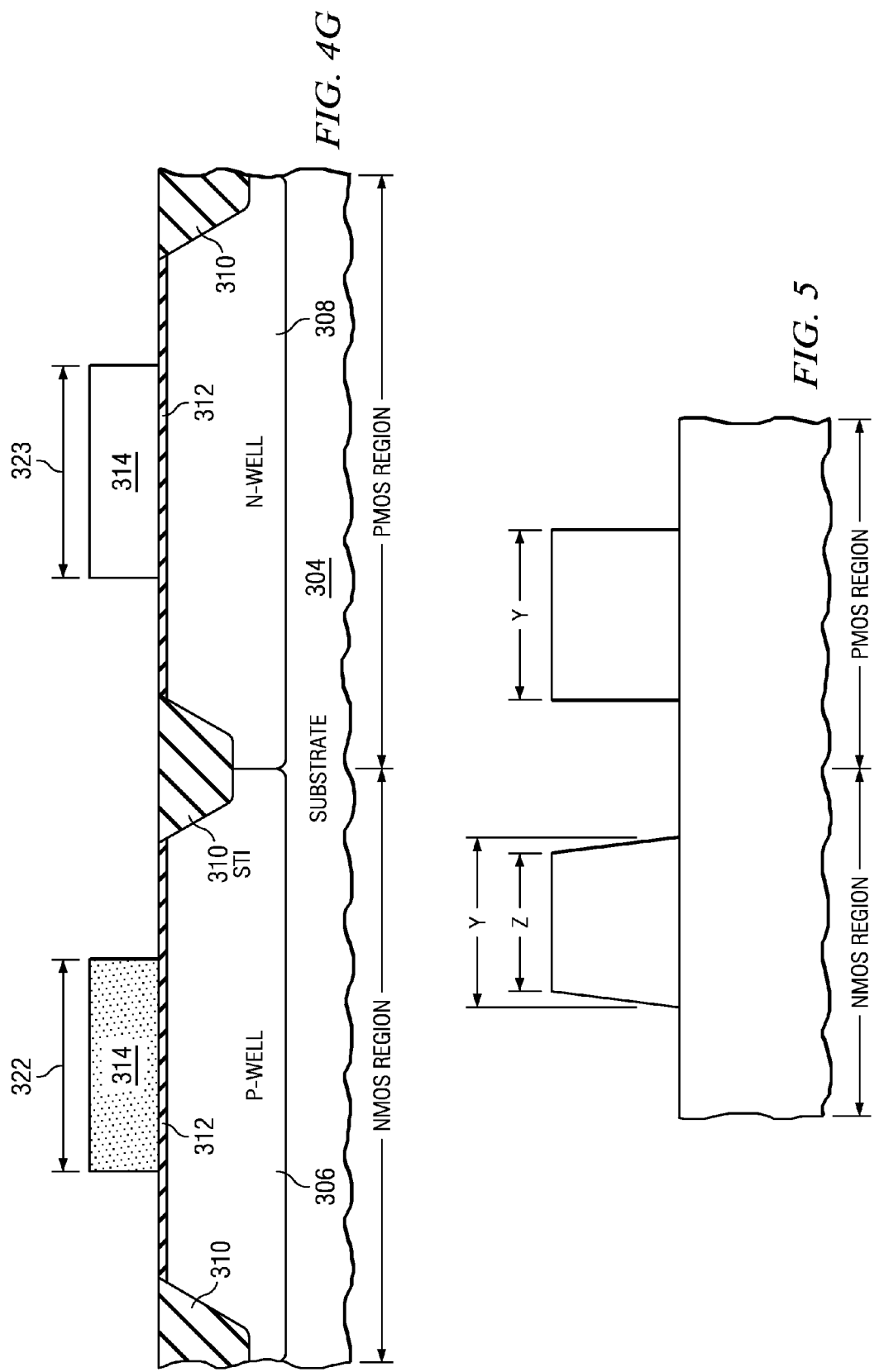

REDUCING GATE CD BIAS IN CMOS PROCESSING

RELATED APPLICATION

This application claims priority to Ser. No. 61/017,859 filed Dec. 31, 2007, which is entitled "Reducing Gate CD Bias in CMOS Processing".

FIELD OF INVENTION

The present invention relates generally to semiconductor fabrication, and more particularly to a device and method of forming NMOS and PMOS transistor with a reduced gate critical dimension (CD) bias therebetween.

BACKGROUND OF THE INVENTION

PMOS and NMOS transistors are common circuit components in many integrated circuits. Such transistors have a source and drain region formed in a semiconductor body, with a channel region residing therebetween. A gate electrode is formed over the channel. Upon proper biasing of the gate electrode and the source/drain regions, the transistors may be selectively controlled. For example, in some instances the transistors are turned completely on or off, wherein the transistors operate as switches. Alternatively, such devices can also be partially activated, wherein such devices operate as variable resistors.

The gate electrode is formed of a conductive material and overlies a gate dielectric. Based on the thickness of the gate dielectric, the drive current of the device can be influenced. Generally speaking, for a given gate dielectric, as its "effective oxide thickness" (EOT) increases, its drive current decreases, and as its EOT decreases, its drive current increases.

When polysilicon is employed as the gate electrode for transistor devices, the polysilicon is often doped to reduce its resistivity. If the dopant does not diffuse all the way down to the underlying dielectric interface, a poly depletion effect occurs, which results in an increase in the transistor EOT.

It is desirable to provide improvements in transistor fabrication.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, its primary purpose is merely to present one or more concepts of the invention in a simplified form as a prelude to the more detailed description that is presented later.

The present invention relates to forming an integrated circuit having NMOS and PMOS transistors, wherein a critical dimension (CD) bias between the NMOS and PMOS is eliminated or at least substantially reduced.

In one embodiment of the invention, a method of forming an integrated circuit having an NMOS transistor and a PMOS transistor is disclosed, and comprises performing pre-gate processing in an NMOS region and a PMOS region over and/or in a semiconductor body. The method further comprises depositing a polysilicon layer over the semiconductor body in both the NMOS and PMOS regions, and performing a first type implant into the polysilicon layer in one of the NMOS region and the PMOS region. In addition, the method comprises performing an amorphizing implant into the polysilicon layer in both the NMOS and PMOS regions, thereby converting the polysilicon layer into an amorphous silicon layer, and patterning the amorphous silicon layer to form gate electrodes, wherein a gate electrode resides in both the NMOS and PMOS regions.

In one embodiment of the invention, the first type implant comprises an n-type implant into the NMOS region of the polysilicon layer. In another embodiment, the first type implant comprises a p-type implant into the PMOS region of the polysilicon layer. In yet another embodiment, an n-type implant is performed into the NMOS portion of the polysilicon layer, and a p-type implant is performed into the PMOS portion of the polysilicon layer.

To the accomplishment of the foregoing and related ends, the following description and annexed drawings set forth in detail certain illustrative aspects and implementations of the invention. These are indicative of but a few of the various ways in which one or more aspects of the present invention may be employed. Other aspects, advantages and novel features of the invention will become apparent from the following detailed description of the invention when considered in conjunction with the annexed drawings.

BRIEF DESCRIPTION OF THE DRAWINGS

FIGS. 4A-4G are fragmentary cross section diagrams illustrating various stages of NMOS and PMOS device fabrication according to the method of FIG. 3;

FIG. 5 is a fragmentary cross section diagram illustrating a reduction or elimination of a critical dimension (CD) bias between NMOS and PMOS transistors resulting from the CMOS fabrication method of FIG. 3;

DETAILED DESCRIPTION OF THE INVENTION

Figure 1:
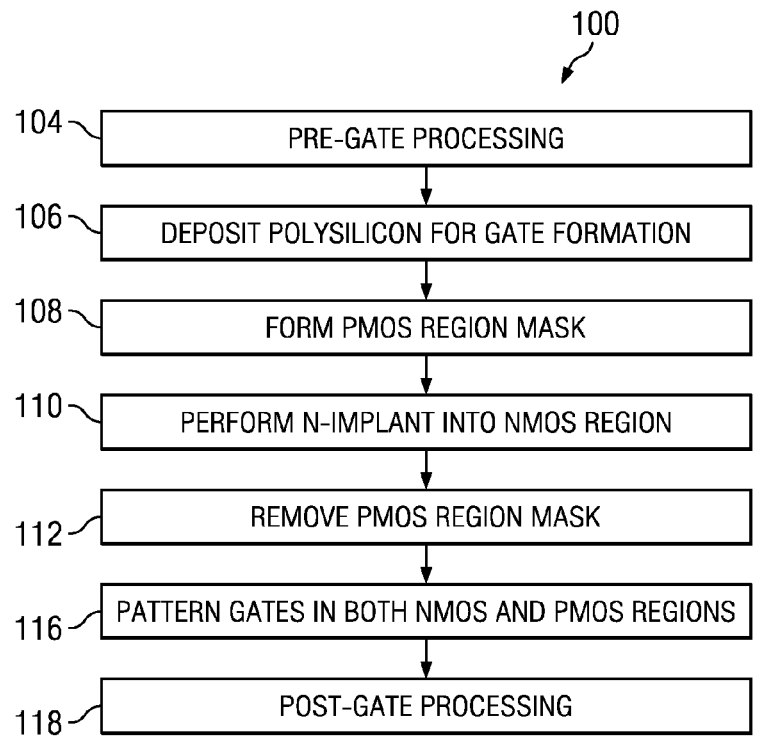
FIG. 1 (Prior Art) is a flow chart diagram illustrating a method of forming NMOS and PMOS transistors in a CMOS fabrication flow.

One or more aspects of the present invention are described with reference to the drawings, wherein like reference numerals are generally utilized to refer to like elements throughout, and wherein the various structures are not necessarily drawn to scale. In the following description, for purposes of explanation, numerous specific details are set forth in order to provide a thorough understanding of one or more aspects of the present invention. It may be evident, however, to one skilled in the art that one or more aspects of the present invention may be practiced with a lesser degree of these specific details. In other instances, well-known structures and devices are shown in block diagram form in order to facilitate describing one or more aspects of the present invention.

The invention relates to a method of forming an integrated circuit having NMOS and PMOS transistors. The method reduces the CD gate electrode bias between the NMOS and PMOS transistors by reducing an effect of differing etch rates of the respective gate electrodes. More particularly, the faster etch rate of n-doped gate electrodes in NMOS devices is substantially reduced by amorphizing the polysilicon layer, thereby rendering the layer amorphous. The amorphization of the polysilicon substantially reduces the difference in the etch rates of the material that results in the NMOS and PMOS gate electrodes, respectively.

The inventors of the present invention identified that when doping NMOS polysilicon gates, the phosphorous dopant employed to dope the NMOS gate affected an etch rate during a subsequent polysilicon gate etch. More particularly, the etch chemistry employed to etch the gate would etch the NMOS regions (that were doped with phosphorous) faster than the PMOS regions (not doped with phosphorous), resulting in a critical dimension bias between the NMOS and PMOS gates. As can be appreciated in processes that employ self-aligned source/drain regions, such CD gate bias causes different channel lengths in the resultant NMOS and PMOS devices. In some instances, these variations are undesirable.

In FIG. 1, a process 100 for fabricating NMOS and PMOS transistors in a CMOS fabrication process is disclosed. The method 100 begins at 104 with pre-gate processing. Such pre-gate processing may include isolation processing such as LOCOS or STI and well formation, such as N-well and P-well formation in PMOS and NMOS regions, respectively. Further, pre-gate processing may include threshold voltage (Vt) adjust implants into active areas and gate dielectric formation such as gate oxides or high-k gate dielectrics.

Polysilicon is deposited at 106, for example, using chemical vapor deposition (CVD) in both NMOS and PMOS regions. A PMOS region mask is then formed over the PMOS regions, thereby exposing the NMOS regions. An n-type dopant implant is then performed into the exposed NMOS regions at 110 to reduce the resistivity of the polysilicon in those regions. Such dopant implant is followed by an anneal to diffuse the dopant throughout the polysilicon in the NMOS regions.

The implant mask is then removed from the PMOS region at 112, followed by a gate patterning process at 116, wherein both NMOS and PMOS gates are patterned concurrently. For example, such patterning is performed by forming and patterning a gate etch mask in both NMOS and PMOS regions, followed by a gate etch which is typically a dry etch to anisotropically pattern the gate electrodes in both the NMOS and PMOS regions concurrently. The process 100 then continues at 118 with post-gate processing that includes, for example, source/drain formation, silicidation processing, and metallization.

Figure 2:
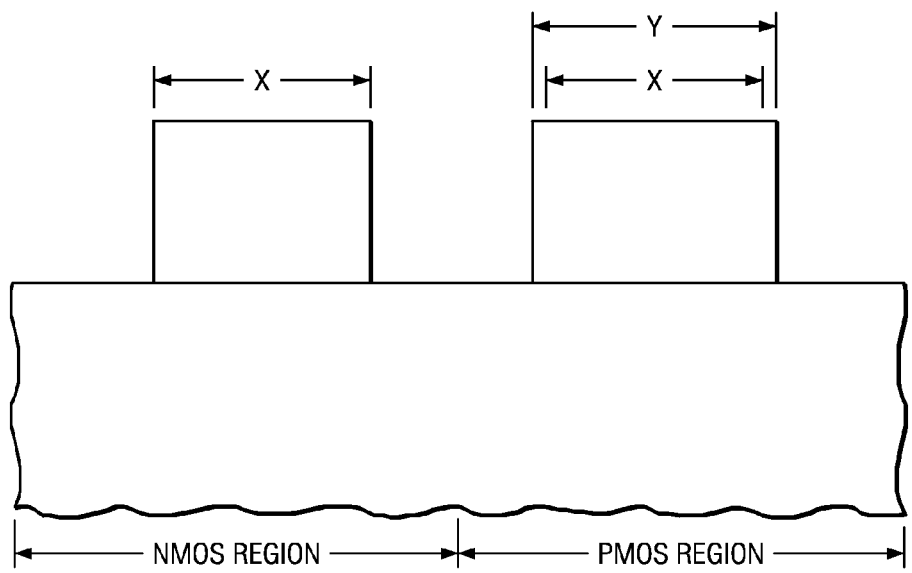
FIG. 2 (Prior Art) is a fragmentary cross section diagram illustrating a critical dimension (CD) bias between NMOS and PMOS transistors resulting from the CMOS fabrication method of FIG. 1.

As can be seen in FIG. 2, the gate patterning process 116 of FIG. 1 causes a gate CD bias. In FIG. 2, a gate critical dimension (CD) that results from the gate etch in the NMOS region is X (e.g., gate length dimension in the NMOS region channel current flow direction), while the resultant CD in the PMOS region is Y (e.g., corresponding gate length dimension in the PMOS region channel current flow direction), wherein Y>X. The inventors of the present invention identified a source of this gate CD bias as the phosphorous dopant in the NMOS region used to lower the resistivity of the NMOS gate. The present invention highlighted below eliminates or at least reduces the gate CD bias between NMOS and PMOS transistors in a CMOS fabrication process flow.

Figure 3:
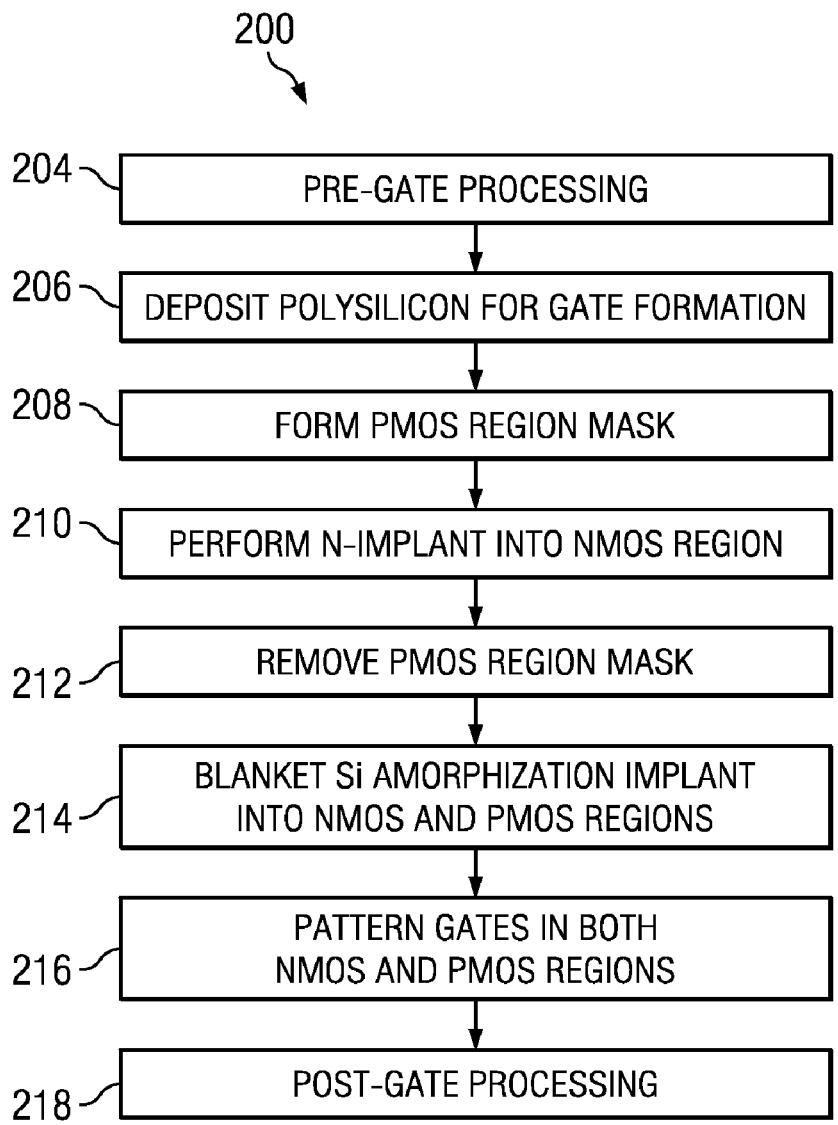
FIG. 3 is a flow chart diagram illustrating a method of forming NMOS and PMOS transistors in a CMOS fabrication flow according to one embodiment of the present invention.

Turning now to FIG. 3, a method 200 for fabricating NMOS and PMOS transistors according to one embodiment of the invention is disclosed. While the example method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the design and fabrication of integrated circuits having transistors illustrated and described herein, as well as in association with other transistors and structures not illustrated, including but not limited to NMOS and/or PMOS transistors.

Figure 4A:
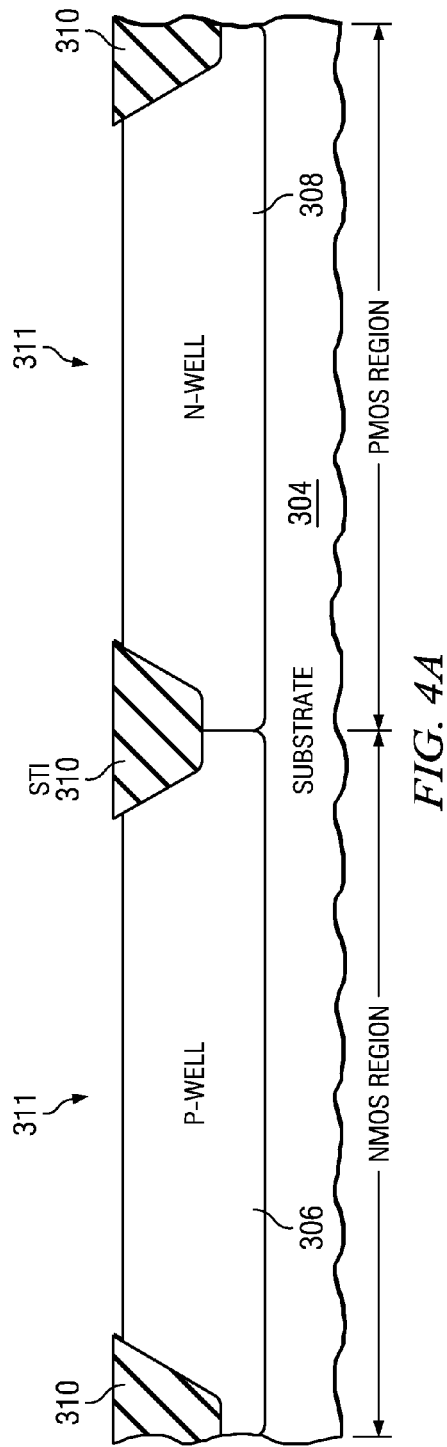

The method 200 begins at pre-gate processing at 204. Such pre-gate processing may include isolation processing, wherein various active areas are defined. In one embodiment of the invention, isolation processing comprises forming shallow trench isolation (STI) regions in a semiconductor body. Referring to FIG. 4A, for example, a semiconductor body 304 may comprise a p-type substrate or epitaxial region formed over a substrate or bulk oxide region in a silicon on insulator (SOI) type device. STI regions 310 are formed in one embodiment by etching one or more trenches into the semiconductor body 304 using an etch mask, followed by a deposition of a dielectric material such as oxide. Such an oxide deposition may comprise a CVD process, followed by a chemical mechanical polish (CMP) process to planarize the device. The STI etch mask is then removed, leaving the STI regions 310 in the semiconductor body 304, and defining one or more active areas 311. While STI regions are shown for isolation processing, other forms of isolation such as LOCOS may also be employed and all such alternatives are contemplated as falling within the scope of the present invention.

Figure 4B:
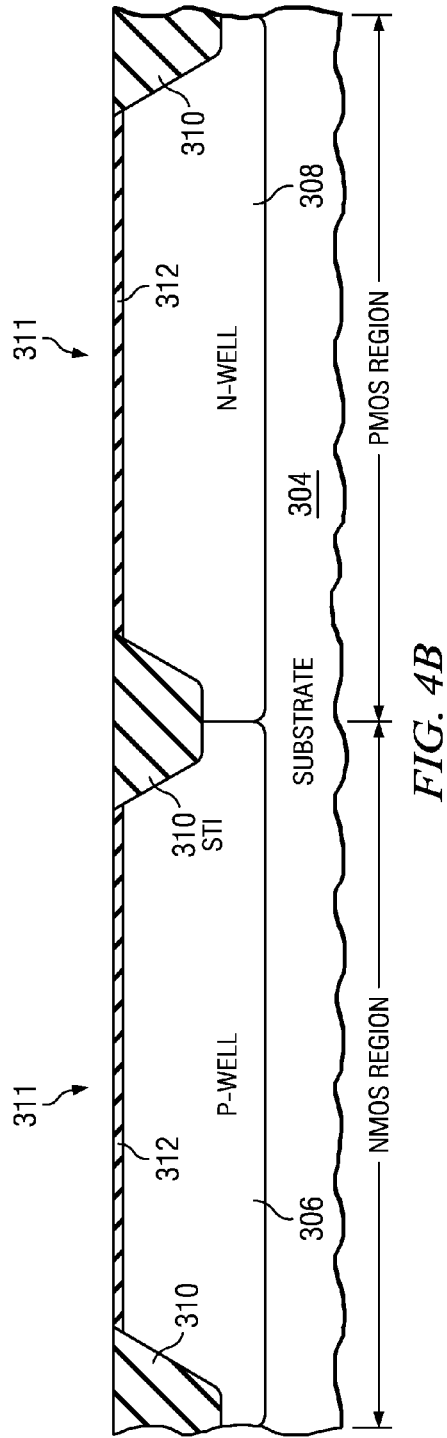

Pre-gate processing 204 of FIGS. 2-3 may further include well formation, such as the formation of N-wells 308 in PMOS regions, and P-wells 306 in NMOS regions, respectively, as illustrated in FIG. 4A. In addition, pre-gate processing may include any form of channel engineering, such as Vt adjust implants or other type process steps. Further still, pre-gate processing includes formation of a gate dielectric over the semiconductor body in both NMOS and PMOS regions. In one embodiment, the gate dielectric comprises a gate oxide formed by thermal oxidation. In another embodiment, the gate dielectric comprises a high-k dielectric or dielectric stack formed by CVD or other deposition processes. Any type of gate dielectric may be employed and such alternatives are contemplated as falling within the scope of the present invention. The gate dielectric is illustrated in FIG. 4B at reference numeral 312.

Figure 4C:
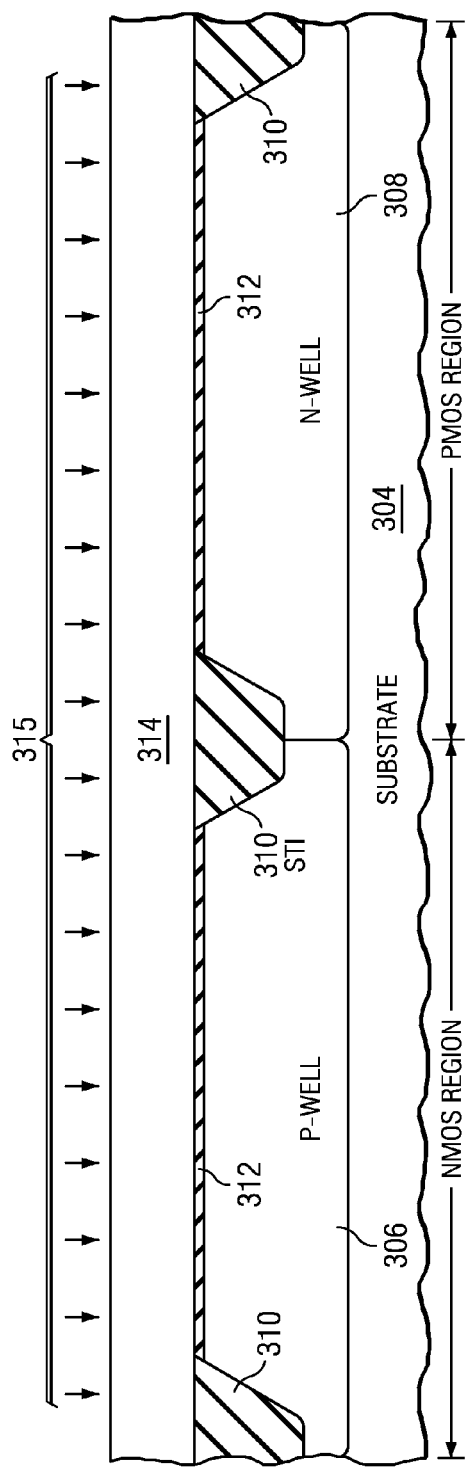
Figure 4D:
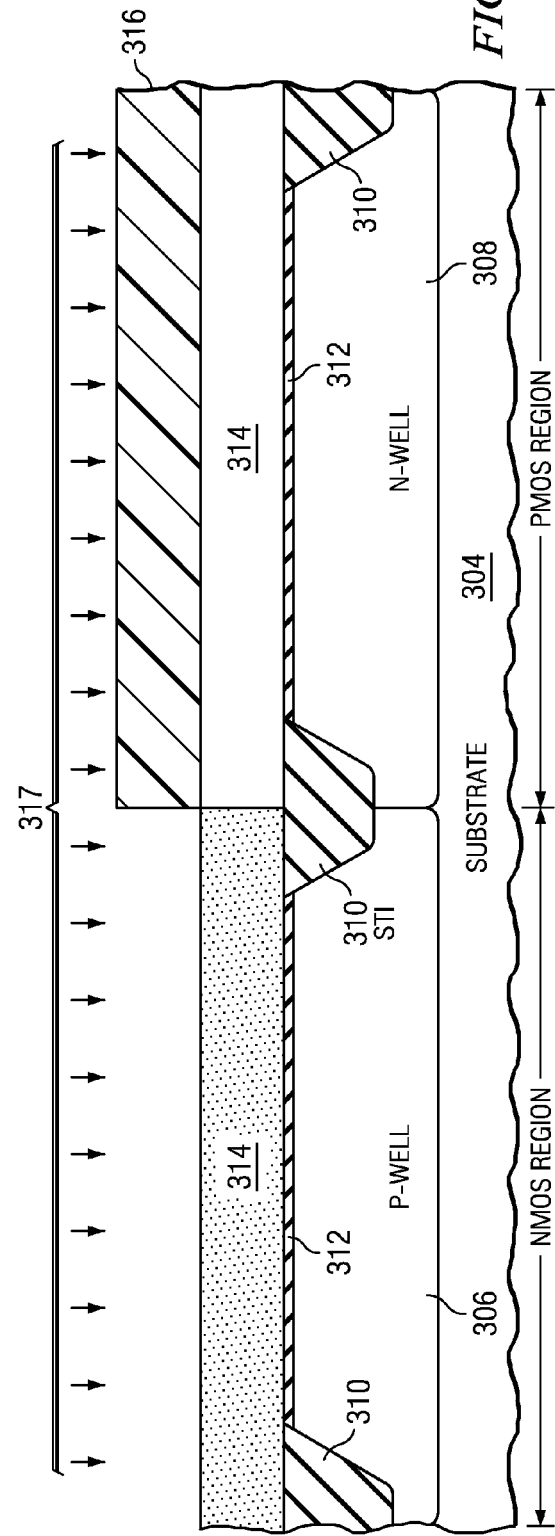

Returning to FIG. 3, the method 200 continues at 206 with the deposition of polysilicon over the semiconductor body 304 and gate dielectric 312. In one embodiment, the deposition is a blanket CVD deposition that covers both NMOS and PMOS regions, and isolation regions, as illustrated at 314 in FIG. 4C. Subsequently, a PMOS region mask 316 is formed over the PMOS region at 208 in FIG. 3. In one embodiment, the mask 316 comprises a nitride layer deposited over NMOS and PMOS regions, and selectively patterned to expose the NMOS regions, as illustrated in FIG. 4D. An n-type implant 317 is then performed at 210 of FIG. 3 to dope the exposed polysilicon 314 in the NMOS region, as illustrated in FIG. 4D. In one embodiment the n-type dopant is phosphorous. As shown, the n-type implant serves to reduce the resistivity of the polysilicon in the NMOS region. The PMOS region mask is then removed at 212.

Figure 4E:
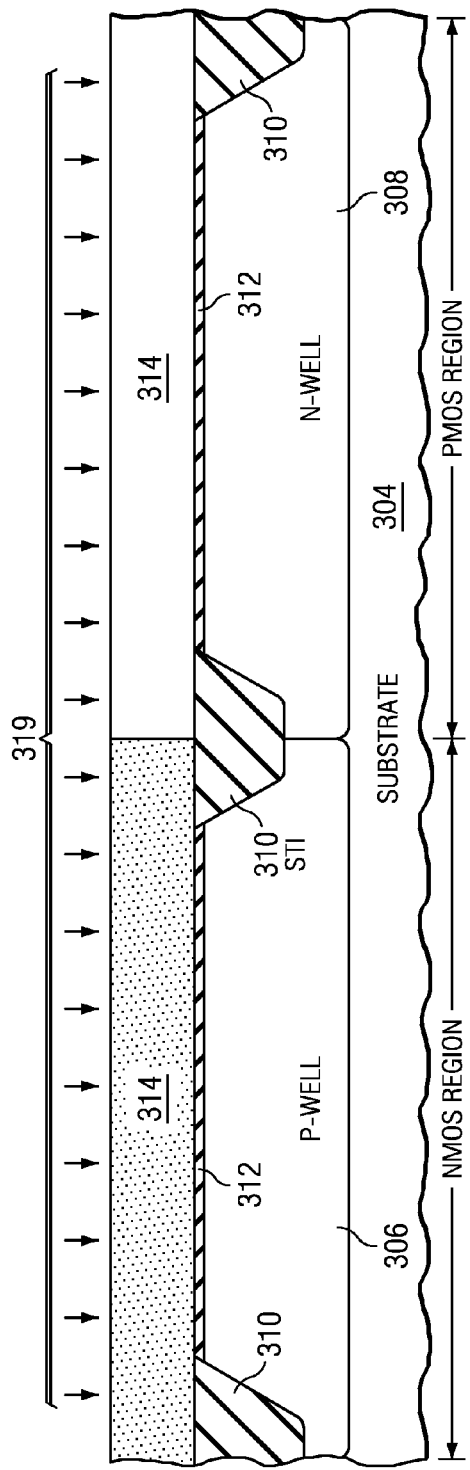

The method 200 of FIG. 3 continues at 214, wherein a blanket amorphization implant is performed into the polysilicon 314 in both the NMOS and PMOS regions. The amorphization implant converts the polysilicon layer 314 into an amorphous silicon layer. In one embodiment the amorphization implant species comprises silicon, however, other amorphizing implant species could be employed and are contemplated as falling within the scope of the present invention. Such an amorphization implant is illustrated in FIG. 4E at reference numeral 319.

Figure 4F:
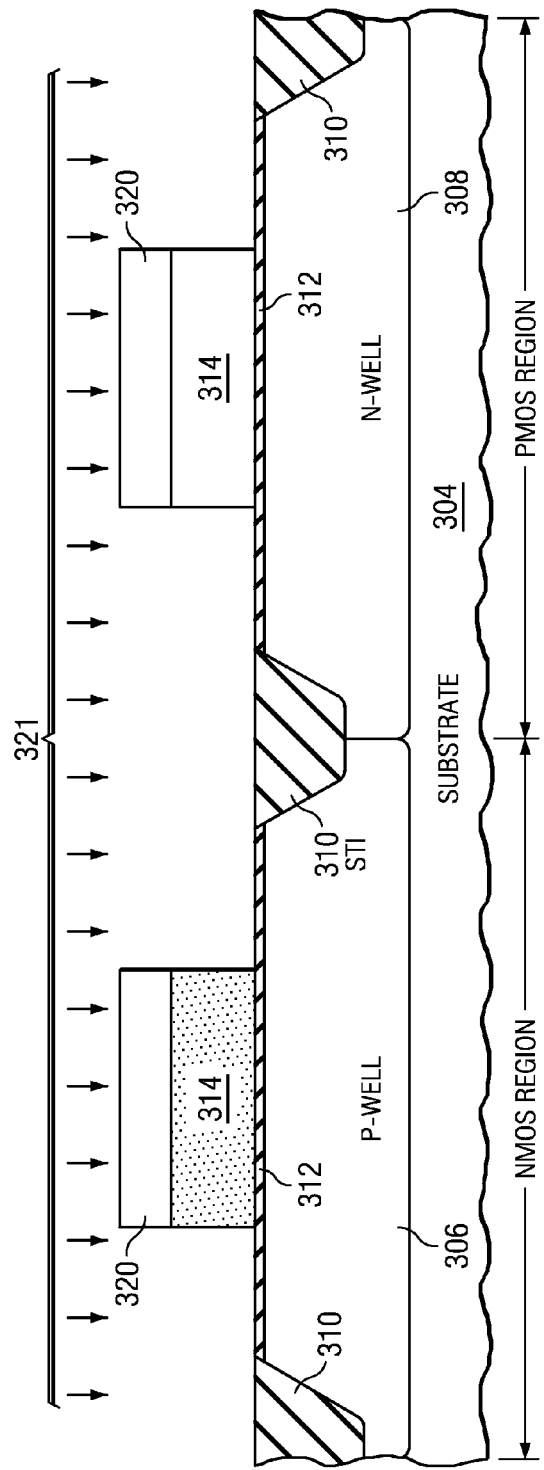

The method 200 continues at 216, wherein the gate electrodes are patterned in the NMOS and PMOS regions in a concurrent manner. In one embodiment an etch mask such as a patterned nitride layer serves to protect portions of the amorphous silicon wherein the desired gate electrodes will reside. The exposed areas of amorphous silicon in both the NMOS and PMOS regions are then etched with an etchant at reference numeral 321 of FIG. 4F. In one embodiment, the etch is a dry plasma etch such as $HBr+NF_3$, however, other etch chemistries may be employed and are contemplated by the present invention. The etch chemistry has an etch rate that is influenced more by the amorphous nature of the silicon in both the NMOS and PMOS regions than the presence of the n-type dopant in the NMOS region. Consequently, the etch rates of the amorphized silicon layer are substantially more similar than in the case of doped and undoped polysilicon. Consequently, the gate CD bias of the resultant patterned gate electrodes in the NMOS and PMOS regions is eliminated or at least substantially reduced. Accordingly, the CD 322 of the gate electrode in the NMOS region is substantially the same as the gate electrode CD 323 in the PMOS region.

In the method 200 of FIG. 3, after the n-type dopant was implanted into the polysilicon layer 314 in the NMOS region, no anneal was performed, and consequently the n-type dopant was not diffused throughout the depth of the polysilicon layer. Since the n-type dopant is a cause of the increased etch rate of the polysilicon, and since without anneal a relatively high concentration of n-type dopant exists at a top of the polysilicon layer 314, even with the amorphization of the silicon, a somewhat higher etch rate may occur near a top portion of the resultant gate electrode. If such a phenomenon is sufficiently prominent, a gate electrode profile may result as illustrated in FIG. 5. Note that in FIG. 5, the gate CD in both the NMOS and PMOS regions is Y, however, a top portion of the gate electrode in the NMOS region exhibits a smaller width of Z, wherein Z<Y. Therefore, according to another embodiment of the invention, this effect may be reduced in the method 400 of FIG. 6.

Figure 6:
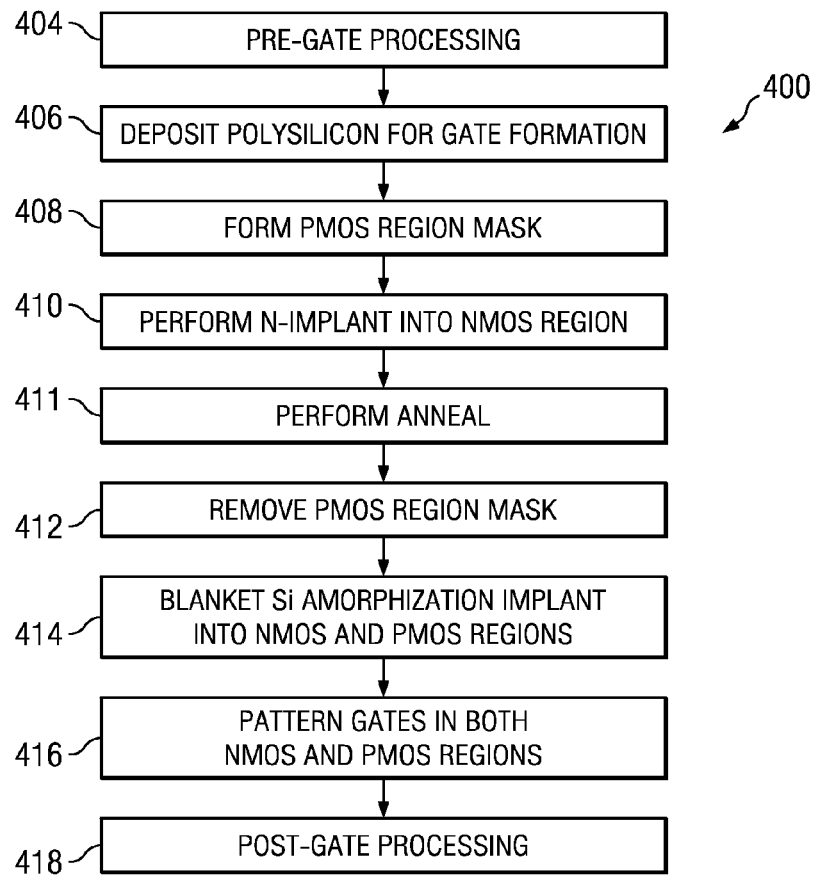
FIG. 6 is a flow chart diagram illustrating a method of forming NMOS and PMOS transistors in a CMOS fabrication flow according to another embodiment of the present invention.

Turning now to FIG. 6, a method 400 of forming NMOS and PMOS transistors is provided. The method 400 comprises acts 404, 406, 408 and 410, which are similar to acts 204, 206, 208 and 210 of FIG. 3. Because such acts are similar, no further discussion is necessary. At 411 an anneal is performed, wherein the n-type dopant that was implanted into the polysilicon in the NMOS region at 410 diffuses substantially evenly throughout the polysilicon in the NMOS regions. The method 400 continues at 412 and 414 in a manner similar to acts 212 and 214 of FIG. 3, wherein the polysilicon in both the NMOS regions and PMOS regions is subjected to an amorphization implant, thereby resulting in an amorphous silicon.

Figure 7:
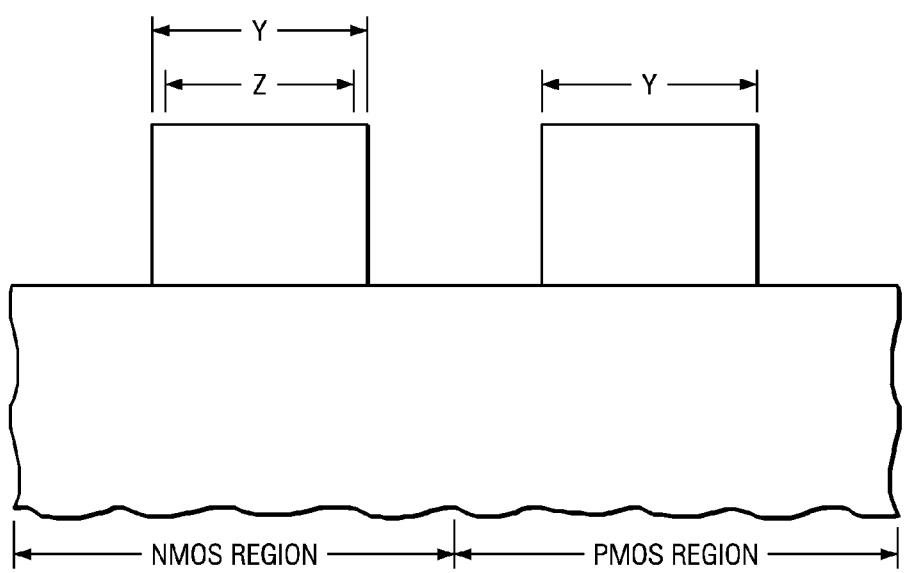
FIG. 7 is a fragmentary cross section diagram illustrating a reduction or elimination of a critical dimension (CD) bias between NMOS and PMOS transistors resulting from the CMOS fabrication method of FIG. 6.

Still referring to FIG. 6, the gate electrodes are then patterned via an etch process at 416 in both the NMOS and PMOS regions. Because of the anneal performed at 411, the n-type dopant is distributed substantially uniformly throughout the depth of the amorphized silicon in the NMOS regions. Consequently, the etch rate of the amorphized silicon in the NMOS regions is substantially uniform throughout the etch process, thereby resulting in substantially more vertical sidewalls. The result of the process 400 of FIG. 6 is illustrated in FIG. 7, wherein the resultant gate electrode CD in the PMOS region is Y, and the resultant gate electrode CD in the NMOS region is also Y. Note that the top portion of the gate electrode in the NMOS region is not sloped due to non-uniform etching, and thus the potential for a reduced top gate CD of Z is eliminated or substantially reduced.

It should be noted that the above embodiments are directed to the case where the NMOS regions of the polysilicon are doped with an n-type dopant such as phosphorous, while the PMOS regions are undoped. The present invention also contemplates situations where both NMOS and PMOS regions are doped, or situations wherein PMOS regions are doped while NMOS regions are undoped.

In the embodiment where both NMOS and PMOS regions are doped, the NMOS regions of polysilicon are doped with n-type dopant, while the PMOS regions of the polysilicon are doped with p-type dopant. In one embodiment, the p-type dopant is boron. In experiments performed with such doping, it was observed that the p-type dopant in the PMOS regions further exaggerated the problem of resulting gate electrode CD bias between NMOS and PMOS transistor devices. Accordingly, it is speculated that the p-type dopant causes a reduction in the etch rate of the polysilicon in the PMOS region while the n-type dopant causes an acceleration of etch rate in the NMOS region. In such instances, an amorphization of both NMOS and PMOS regions causes the amorphization of the previous polysilicon layer to dominate over the effect of the respective dopants, thereby causing a substantial reduction in the gate electrode CD bias between the resultant NMOS and PMOS transistors.

In an embodiment where a p-type dopant is implanted into polysilicon in the PMOS region while the NMOS region is left undoped, the present invention comprises performing an amorphization (e.g., using silicon as an amorphizing species) in both NMOS and PMOS regions. In this embodiment, the reduction in etch rate caused by the p-type dopant is overwhelmed by the impact of the amorphous silicon, and thus the etch rates of the amorphous silicon in the NMOS and PMOS regions are substantially closer to one another. Consequently, a reduction in gate electrode CD bias in resultant NMOS and PMOS transistors is observed.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated example implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising." It is also to be appreciated that elements and/or layers depicted herein are illustrated with particular dimensions relative to one another (e.g., layer-to-layer dimensions and/or orientations) for purposes of simplicity and ease of understanding, and that the actual dimensions of such elements/layers may differ substantially from those illustrated herein. Further, it is also to be appreciated that the ordering of the acts described herein can be altered and that any such re-ordering is contemplated as falling within the scope of one or more aspects of the present invention.

What is claimed is:

1. A method of forming an integrated circuit having an NMOS transistor and a PMOS transistor, comprising:
    depositing a polysilicon layer over a semiconductor body in both NMOS and PMOS regions;
    performing a first type implant into the polysilicon layer in one of the NMOS region or the PMOS region;
    performing an amorphizing implant into the polysilicon layer in both the NMOS and PMOS regions, thereby converting the polysilicon layer into an amorphous silicon layer; and
    patterning the amorphous silicon layer to form gate electrodes, wherein a gate electrode resides in both the NMOS and PMOS regions.

2. The method of claim 1, further comprising performing a second type implant that is different from the first type implant into the other of the NMOS region or the PMOS region.

3. The method of claim 2, wherein the first type implant comprises an n-type implant into the NMOS region, and the second type implant comprises a p-type implant into the PMOS region.

4. The method of claim 1, wherein the amorphizing implant is performed after the first type implant.

5. The method of claim 1, wherein the amorphizing implant is performed with a dopant species comprising silicon.

6. The method of claim 1, further comprising performing an anneal after the first type implant and before the amorphizing implant.

7. The method of claim 1, further comprising performing post-gate processing after patterning the amorphous silicon layer.

8. The method of claim 7, wherein performing post-gate processing comprises forming source/drains in the semiconductor body in both the NMOS and PMOS regions, wherein the source/drains in the NMOS regions comprise n-type regions, and the source/drain in the PMOS region comprise p-type regions.

9. The method of claim 1, further comprising performing an anneal after patterning the gate electrodes to reduce the resistivity of the gate electrodes in both the NMOS and PMOS regions.

10. The method of claim 1, wherein the first type implant comprises a phosphorous implant into the polysilicon layer is the NMOS region.

11. A method of forming an integrated circuit having NMOS and PMOS transistors, comprising:
    forming a polysilicon layer over a gate dielectric in both an NMOS region and a PMOS region;
    doping the polysilicon layer with a first type dopant in one of the NMOS region or the PMOS region;
    amorphizing the polysilicon layer in both the NMOS and PMOS regions, thereby forming an amorphous silicon layer; and
    forming a gate electrode in the NMOS region and a gate electrode in the PMOS region concurrently by patterning the amorphized polysilicon layer.

12. The method of claim 11, further comprising doping the polysilicon layer with a second type dopant that is different the first type dopant in the other of the NMOS region or the PMOS region.

13. The method of claim 12, wherein doping with the first type dopant comprises an n-type implant into the NMOS region, and doping with the second type dopant comprises a p-type implant into the PMOS region.

14. The method of claim 11, wherein amorphizing the polysilicon layer occurs after doping with the first type dopant.

15. The method of claim 11, wherein doping with the first type dopant comprises doping with an n-type dopant in the NMOS region, and comprises:
    forming a mask over the polysilicon layer in the PMOS region;
    performing a phosphorous implant into the polysilicon layer in the NMOS region after forming the mask; and
    removing the mask after performing the phosphorous implant.

16. The method of claim 11, further comprising:
    defining the NMOS and PMOS regions by forming isolation regions in a semiconductor body and forming a P-well in the semiconductor body in the NMOS region, and an N-well in the semiconductor body in the PMOS region; and
    forming the gate dielectric over the semiconductor body in both the NMOS and PMOS regions.

17. The method of claim 11, wherein amorphizing the polysilicon layer comprises implanting the polysilicon layer with an amorphizing dopant species.

18. The method of claim 17, wherein the amorphizing dopant species comprises silicon.

19. The method of claim 11, further comprising performing an anneal after doping with the first type dopant and before amorphizing the polysilicon layer.

20. The method of claim 11, further comprising:
    forming n-type source/drain regions in the NMOS region on opposing sides of the gate electrode formed in the NMOS region; and
    forming p-type source/drain regions in the PMOS region on opposing sides of the gate electrode formed in the PMOS region.

21. A method of forming an integrated circuit having NMOS and PMOS transistors, comprising:
    forming a polysilicon layer over a gate dielectric in both an NMOS region and a PMOS region;
    doping the polysilicon layer with an n-type dopant in the NMOS region;
    implanting silicon into the polysilicon layer in both the NMOS and PMOS regions; and
    forming gate electrodes in the NMOS and PMOS region by patterning the polysilicon layer after the silicon implant.

22. The method of claim 21, further comprising annealing the polysilicon layer after doping with the n-type dopant and before forming the gate electrodes.

23. The method of claim 21, wherein doping with the n-type dopant is done before implanting the silicon into the polysilicon layer.

24. The method of claim 21, further comprising doping the polysilicon layer with a p-type dopant in the PMOS region before forming the gate electrodes.

25. The method of claim 21, wherein forming the gate electrodes comprises etching the polysilicon layer with a dry plasma etch.

26. A method of forming an integrated circuit having NMOS and PMOS transistors, comprising:
- depositing a polysilicon layer over a gate dielectric in both an NMOS region and a PMOS region;
- doping the polysilicon layer with an n-type dopant in the NMOS region;
- doping the polysilicon layer with p-type dopant in the PMOS region;
- performing an anneal;
- after doping the polysilicon layer with the n-type and p-type dopants, amorphizing the polysilicon layer in both the NMOS and PMOS regions; and
- after amorphizing the polysilicon layer, forming gate electrodes in the NMOS and PMOS region by patterning the polysilicon layer with a dry plasma etch.

* * * * *